United States Patent
Kuznetsov et al.

(10) Patent No.: US 9,822,447 B2
(45) Date of Patent: Nov. 21, 2017

(54) DYNAMIC FLUID VALVE AND METHOD FOR ESTABLISHING THE SAME

(75) Inventors: Vladimir Kuznetsov, Utrecht (NL); Pieter Tak, Amersfoort (NL)

(73) Assignee: ASM INTERNATIONAL N.V., Almere (NL)

( * ) Notice: Subject to any disclaimer, the term of this patent is extended or adjusted under 35 U.S.C. 154(b) by 140 days.

(21) Appl. No.: 13/576,145

(22) PCT Filed: Jan. 31, 2011

(86) PCT No.: PCT/NL2011/050059
§ 371 (c)(1),
(2), (4) Date: Oct. 22, 2012

(87) PCT Pub. No.: WO2011/093709
PCT Pub. Date: Aug. 4, 2011

(65) Prior Publication Data
US 2013/0052347 A1 Feb. 28, 2013

(30) Foreign Application Priority Data
Feb. 1, 2010 (NL) ...................................... 2004177

(51) Int. Cl.
*C23C 16/455* (2006.01)
*C23C 16/458* (2006.01)
(Continued)

(52) U.S. Cl.
CPC ...... *C23C 16/45551* (2013.01); *C23C 14/568* (2013.01); *H01L 21/67784* (2013.01)

(58) Field of Classification Search
None
See application file for complete search history.

(56) References Cited

U.S. PATENT DOCUMENTS 4,226,526 A * 10/1980 Spence-Bate et al. ......... 355/53
4,495,024 A * 1/1985 Bok .................................. 216/57
(Continued)

FOREIGN PATENT DOCUMENTS

| JP | H08-274459 A | 10/1996 |
|---|---|---|
| WO | 85/04071 A1 | 9/1985 |
| WO | 2009/142487 A1 | 11/2009 |

OTHER PUBLICATIONS

International Search Report dated Apr. 19, 2011 for PCT Patent Application No. PCT/NL2011/050059, 2 pages.

*Primary Examiner* — Karla Moore
(74) *Attorney, Agent, or Firm* — Preti Flaherty Beliveau & Pachios LLP

(57) ABSTRACT

A method, comprising: —providing a process space atmosphere at a process space atmosphere pressure; —providing an exterior atmosphere at an exterior atmosphere pressure that is different from the process space atmosphere pressure; —providing a passage via which the exterior atmosphere is in open communication with the process space atmosphere, and via which substrates are exchangeable between the exterior atmosphere and the process space atmosphere; —injecting an exchange fluid into the passage at at least one exchange fluid injection point, so as to effect a flow of exchange fluid that extends through at least a part of the passage, wherein said flow is directed towards —the exterior in case the exterior atmosphere pressure is greater than the process space atmosphere pressure; or —the process space in case the exterior atmosphere pressure is smaller than the process space atmosphere pressure.

21 Claims, 2 Drawing Sheets

(51) Int. Cl.
   *C23C 16/54*    (2006.01)
   *C23C 14/56*    (2006.01)
   *H01L 21/677*   (2006.01)

(56)         References Cited

U.S. PATENT DOCUMENTS 4,622,918  A      11/1986  Bok
   4,635,586  A  *   1/1987   Diener et al. ................. 118/718
   2006/0054774 A1* 3/2006   Yassour ................. B65G 51/03
                                                            248/631
   2007/0160454 A1* 7/2007   Lida ..................... B65G 49/065
                                                            414/806
   2009/0291209 A1* 11/2009  Granneman et al. ...... 427/255.5

\* cited by examiner

DYNAMIC FLUID VALVE AND METHOD FOR ESTABLISHING THE SAME

This application is a U.S. National Phase under 35 USC 371 of PCT Application No. PCT/NL2011/050059 filed Jan. 31, 2011, which claims priority to the Netherlands Application No. 2004177, filed Feb. 1, 2010, the disclosures of which are incorporated by reference herein.

FIELD OF THE INVENTION

The present invention relates to the field of substrate processing, and, more particularly, to an apparatus and method for establishing a fluid valve for separating a process space atmosphere from an exterior atmosphere while allowing substrates to be exchanged therebetween.

BACKGROUND

A substrate processing apparatus may include a process space that, during operation, holds a gaseous atmosphere into and from which substrates may be inserted and extracted, respectively. The process space atmosphere may typically have characteristics that are different from those of an exterior atmosphere of the apparatus. The process space atmosphere may for example differ from the exterior atmosphere in chemical composition, temperature and/or pressure.

In case a process space atmosphere is maintained at a pressure that differs from that of the exterior atmosphere, any open connection between them is subject to a pressure differential that tends to drive atmospheric fluid from the atmosphere with the higher pressure, through the connection, towards the atmosphere with the lower pressure. Such a flow of atmospheric fluid may lead to contamination of the receiving atmosphere and to possible depletion of the supplying atmosphere. Furthermore, a substrate that is being exchanged between the exterior and the process space via the open connection is also subjected to the pressure differential. Although the pressure differential may be relatively small, it may still have a significant effect on the substrate. This is particularly so when the mass of the substrate is likewise small and the substrate is handled contactlessly (i.e. without mechanical contacts that restrain its motion).

To prevent the exterior atmosphere from mixing with the process space atmosphere, while at the same time enabling the exchange of substrates between them, the exterior may conventionally be connected to the process space via an air lock or a similar device. An air lock may provide for an intermediate space that can be selectively brought into communication with the exterior and the process space. Accordingly, a substrate may be exchanged between the exterior and the process space via the intermediate space, without bringing the exterior space and the process space in direct open communication with each other. By appropriately pressurizing the intermediate space, the air lock may also prevent the substrate from being subjected to the pressure differential, i.e. from being subjected to different pressures at different ends at the same time. However, air locks and the like have the drawback that they operate relatively slowly. This is partly due to their mechanical nature, and partly to the fact that their very design is aimed at the singular or batch-wise exchange of substrates between the exterior and the process space. As a result, the use of air locks may be accompanied by a detrimental effect on the through-put capacity of an apparatus. That is to say, the air lock may limit the rate at which substrates may be inserted into or extracted from the process space.

It is an object of the present invention to provide for an apparatus and a method that overcome or mitigate one or more of the above-mentioned problems, and that enable an open communication between an exterior and a process space comprising atmospheres at different pressures, which open communication allows substrates to be continuously exchanged between the exterior and the process space.

SUMMARY OF THE INVENTION

One aspect of the present invention is directed to a substrate processing apparatus. The apparatus includes a process space, and pressure regulation means, configured to maintain a process space atmosphere in said process space at a process space atmosphere pressure that is different from an exterior atmosphere pressure of an exterior atmosphere in an exterior of the substrate processing apparatus. The apparatus further includes a passage that extends in a passage direction, via which passage the exterior of the substrate processing apparatus is in open communication with the process space, and through which substrates are exchangeable between the exterior and the process space. The apparatus also includes exchange fluid injection means, configured to inject an exchange fluid into the passage at at least one exchange fluid injection point, so as to effect a flow of exchange fluid that extends through at least a part of the passage. Said flow is directed towards the exterior in case the exterior atmosphere pressure is greater than the process space atmosphere pressure, and towards the process space in case the exterior atmosphere pressure is smaller than the process space atmosphere pressure.

The exchange fluid injection means may include an exchange fluid injection channel that terminates in the exchange fluid injection point. At least a downstream portion of the exchange fluid injection channel, i.e. a portion thereof adjacent to the exchange fluid injection point, may include an acute angle (which may preferably be in the range of 0-45 degrees) with the passage direction such that exchange fluid that is injected into the passage will be imparted with a velocity component in the direction of the atmosphere with the higher pressure.

Another aspect of the present invention is directed to a method. The method includes providing a process space atmosphere at a process space atmosphere pressure, and providing an exterior atmosphere at an exterior atmosphere pressure that is different from the process space atmosphere pressure. The method also includes providing a passage via which the exterior atmosphere is in open communication with the process space atmosphere, and via which substrates are exchangeable between the exterior atmosphere and the process space atmosphere. The method further includes injecting an exchange fluid into the passage at at least one exchange fluid injection point, so as to effect a flow of exchange fluid that extends through at least a part of the passage. The flow is directed towards the exterior atmosphere in case the exterior atmosphere pressure is greater than the process space atmosphere pressure, and towards the process space atmosphere in case the exterior atmosphere pressure is smaller than the process space atmosphere pressure.

The present invention features a passage that interconnects the exterior atmosphere and the process space atmosphere. The passage may be mechanically 'open' during operation, enabling substrates to be freely exchanged between the two atmospheres.

To prevent the pressure differential across the passage from uncontrollably driving a flow of atmospheric fluid from the exterior atmosphere towards the process space atmosphere, or vice versa, an exchange fluid is injected into the passage. This is done in such a manner that a flow of exchange fluid, directed towards the atmosphere having the highest pressure, is effected through at least a part of the passage. For example, in case the process space atmosphere is maintained at an overpressure relative to the exterior atmosphere, the exchange fluid is injected into the passage such that it flows towards the process space. The exchange fluid is thus made to flow oppositely to the pressure differential across the passage. As the injected exchange fluid flows through the passage, it will gradually slow down while its (static) pressure increases, until it eventually loses its momentum. Such stagnation may be made to occur at any desirable point, for example at a point near an end of the passage from where the exchange fluid may either diffuse into the respective atmosphere or be otherwise discharged. The point to appreciate is that the flow of exchange fluid occupies at least a portion of the passage, and thereby determines the pressure profile therein. By carefully selecting the injection parameters, such as the flow rate at which exchange fluid is injected, the pressure differential across the passage may be partly or wholly compensated/negated by the pressure profile inside the passage. Accordingly, the natural tendency of the atmospheric fluid of the higher pressure atmosphere to flow towards the lower pressure atmosphere may be regulated.

Apart from determining the pressure profile in at least a portion of the passage, the flow of exchange fluid also effects a drag on a substrate that is being exchanged via the passage. The drag force on the substrate is directed oppositely to the pressure differential across the passage. As a result the drag force mitigates the effect of the pressure differential on the substrate, and may even cancel or overcome it. For example, in case the process space atmosphere is maintained at an overpressure relative to the exterior atmosphere, the net force on a substrate held still in the passage (but sticking out at both ends thereof into the respective atmospheres) may be directed towards the process space, even though the pressure differential across the substrate may force it outwards to the exterior. The drag force may thus be used to facilitate the insertion of substrates into the higher pressure process. Use of the drag force for this and other purposes will be described infra.

With regard to the terminology used in this text, the following is noted. The term 'static pressure' refers to the thermodynamic pressure of a fluid; in case a fluid is in motion, its value for any point in the fluid can be measured by moving along with that point, thus being 'static' relative thereto. The terms 'dynamic pressure', and 'stagnation pressure' are associated with Bernoulli's equation for incompressible fluid flows, and arise from the conversion of kinetic energy in a flowing fluid into a pressure rise as the fluid is brought to rest. For incompressible flows, the dynamic pressure is equal to the difference between the static pressure and the stagnation pressure. In the art 'dynamic pressure' is sometimes referred to as 'impact pressure', in particular when discussing compressible flows. This text will refer to the concept by the term 'dynamic pressure' only. Stagnation pressure, in turn, is the static pressure at a stagnation point in a fluid flow, i.e. the pressure in a point in the fluid where its velocity is zero.

Although the exchange fluid need not be an incompressible fluid, it may obey the laws applicable to incompressible fluids to good approximation in many situations. In this text the exchange fluid will therefore be dealt with in incompressible flow-terminology. In particular the relation between the stagnation pressure, the static pressure and the dynamic pressure of an incompressible flow will be assumed to hold for the exchange fluid. In situations wherein the assumption of incompressible flow behavior cannot be maintained, the terminology of this text is to be construed as referring to corresponding concepts used in compressible flow-theory, known in the art.

Further, in this text the term 'atmosphere' intends to include any local fluid, typically gaseous, mass or medium of any desired chemical composition. Hence the term atmosphere is not to be construed as mererely referring to a mass of air. Where this text refers to the 'pressure' of an atmosphere or the like without further specification in terms of 'static' or 'dynamic', the text refers to the static pressure, typically a point adjacent a respective end of the passage. The term 'open communication' refers to any connection that is not mechanically closed or sealed off. The phrase 'substantially equal to' may, where a quantitative interpretation is required, generally be construed as 'equal to/within the range of the specified quantity ±20%'.

According to an elaboration of the invention, the passage may comprise a stagnation region (or passage portion), located downstream of the at least one injection point, which stagnation region may further be connected to (e.g. be provided at an end of) an exchange fluid discharge channel. For clarity, it is noted that 'downstream' here refers to the direction of the flow of exchange fluid in the passage.

The passage forms an open connection between the exterior and the process space. Consequently, a flow of exchange fluid traveling through the passage and having sufficient momentum might be forced into the exterior or the process space—whichever of the two has the atmosphere of the highest pressure and thus defines the target direction of the fluid flow—before it comes to rest or stagnates. If the flow of exchange fluid would stagnate in the exterior atmosphere or the process space atmosphere, the exchange fluid would subsequently diffuse therein. Although this need not be an issue, it may be desirable to keep the exchange fluid substantially separated from the exterior atmosphere and/or the process space atmosphere. This may be effected by designating a portion of the passage as a stagnation region, and providing this portion with an exchange fluid discharge channel. During operation, the stagnation region may form the location just upstream of the point where the exchange fluid flow encounters the atmosphere of the highest pressure, and at least partially stagnates. To prevent accumulation of exchange fluid in the stagnation region (which would be accompanied by an upstream retreat of the point where stagnation takes place), the exchange fluid discharge channel is provided. This channel is configured to discharge the exchange fluid from the stagnation region to a suitable location.

According to one embodiment of the invention, the exchange fluid discharge channel may be connected to the exchange fluid injection means, such that—during operation—exchange fluid discharged from the stagnation region is fed to the exchange fluid injection means for injection into the passage.

The exchange fluid may thus be circulated: after the exchange fluid injection means inject the exchange fluid into the passage, the exchange fluid flows to the stagnation region where it stagnates, and from where it is subsequently discharged via the exchange fluid discharge channel back to the exchange fluid injection means. In some embodiments of the invention, in particular those employing air as the exchange fluid, the circulation path of the exchange fluid may include the exterior atmosphere. The exchange fluid discharge channel may for example be in open communication with the exterior and be configured to discharge exchange fluid from the stagnation region to the exterior, while the exchange fluid injection means may be configured to withdraw exchange fluid from the exterior. Such an air-based embodiment obviates the need for an accurately sealed circulation path along which a selected exchange fluid may be transported.

According to a further elaboration, the exchange fluid injection means may be configured to inject the exchange fluid into the passage at such a flow rate, that the flow of exchange fluid through the passage stagnates in the stagnation region.

The location at which stagnation of the flow of exchange fluid occurs may be determined by selecting the flow rate at which exchange fluid is injected into the passage. Generally, a higher injection flow rate will effect a further downstream stagnation location. The flow rate may be chosen such that stagnation of the flow of exchange fluid occurs in the stagnation region. In that case, the pressure in the stagnation region will settle at a stagnation pressure that is substantially equal to the greater one of the exterior atmosphere pressure and the process space pressure. This allows the stagnation region to serve as a dynamic fluid valve that closes off the passage from the higher pressure atmosphere.

Selection of the flow rate at which the exchange fluid is injected into the passage may entail the selection of the static pressure and dynamic pressure of the exchange fluid upon injection. In one embodiment of the present invention, the exchange fluid injection means may be configured to inject the exchange fluid at a static pressure that is substantially equal to the smaller one of the exterior atmosphere pressure and the process space pressure. In another embodiment, the exchange fluid injection means may be configured to inject the exchange fluid at a dynamic pressure that is substantially equal to the absolute difference between the exterior atmosphere pressure and the process space pressure.

Such a selection of static and dynamic pressure may ensure a dynamic equilibrium in the passage, which equilibrium may enable optimal separation between the exchange fluid flow and the exterior and process space atmospheres. At the injection point, the static pressure may prevail and the pressure in the exchange fluid may be substantially equal to the pressure of the lower pressure atmosphere. There where the fluid flow stagnates, the kinetic potential of the flow may be transformed into a thermodynamic pressure so as to yield a stagnation pressure that is substantially equal to the higher pressure atmosphere. Accordingly, the pressure differential across the passage may be balanced by the exchange fluid flow in the passage, which renders the passage effectively unaccessible to fluids from the adjacent atmospheres.

According to a further elaboration of the invention the passage may extend in a passage direction, and the exchange fluid injection means may be configured to effect a substantially laminar exchange fluid flow that is directed substantially parallel to said passage direction.

As the passage serves to exchange substrates, some of which may be fragile, the flow regime inside the passage may preferably be laminar (as opposed to turbulent). In addition, the flow of exchange fluid may preferably extend in a direction parallel to the passage direction, i.e. the direction along which substrates are transported through the passage, so as to prevent unbalanced flow components from straining the substrate and/or pushing it towards or against the bounding walls of the passage.

In an embodiment of the invention, the passage may be bounded by at least an upper passage wall and a lower passage wall, and both the upper and lower passage wall may be provided with at least one exchange fluid injection channel. The at least one exchange fluid injection channel in the upper passage wall may be configured to provide for an upper exchange fluid bearing, while the at least one exchange fluid injection point in the lower passage wall may be configured to provide for a lower exchange fluid bearing. Said exchange fluid bearings may be configured to floatingly support and accommodate a substrate there between. Accordingly, the passage may be configured to contactlessly exchange the substrates between the exterior and the process space, cushioning and bearing them on opposite sides to prevent mechanical contact with any bounding walls of the passage.

The above and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
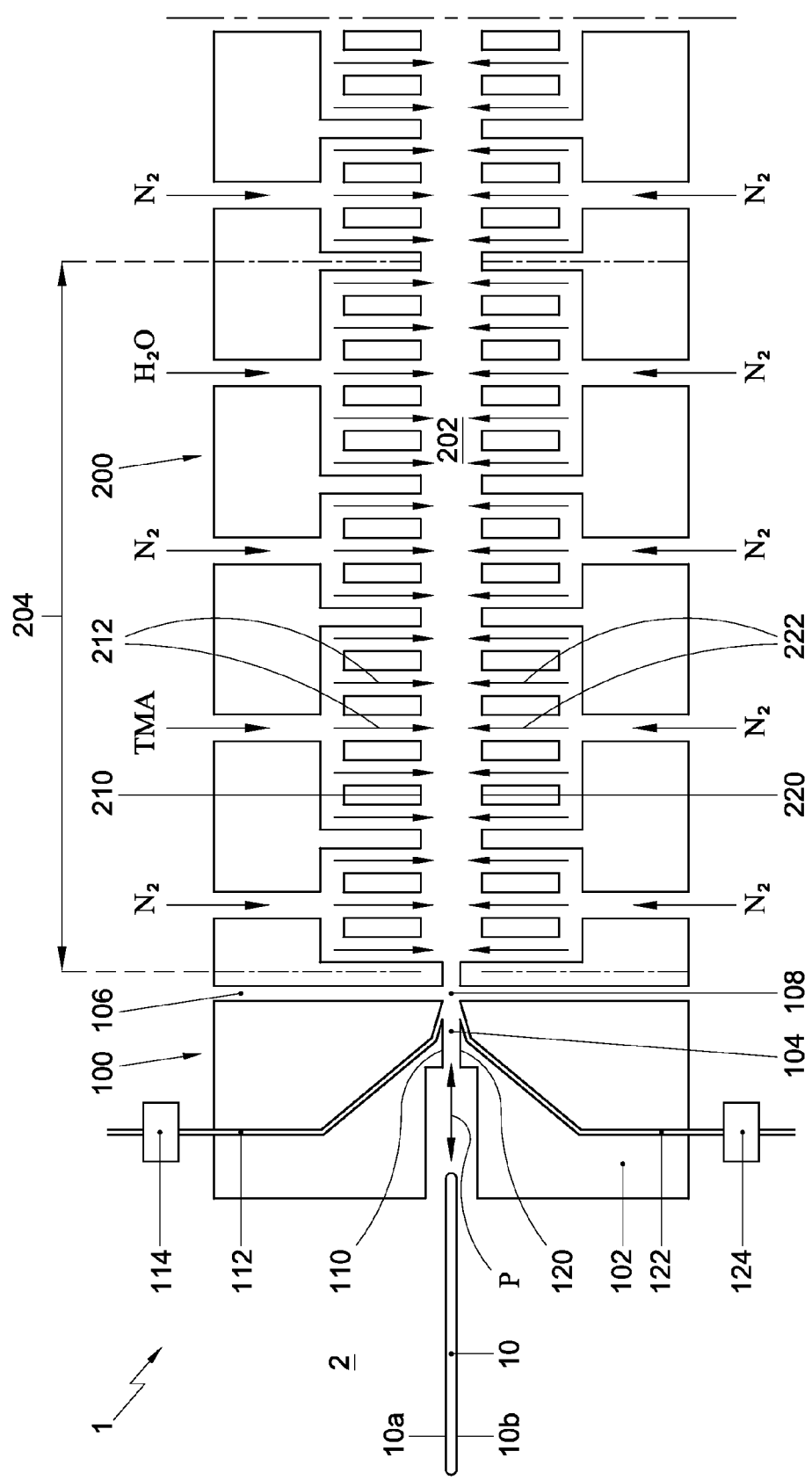
FIG. 1 schematically illustrates, in a longitudinal cross-sectional side view, an exemplary substrate processing apparatus according to the present invention, including a substrate exchange section (on the left) and a process tunnel (on the right)

The construction of the apparatus according to the present invention will be described below in general terms. In doing so, reference will be made to the exemplary embodiment shown in FIG. 1, which is set up as a spatial atomic layer deposition (ALD) apparatus 1 for processing floatingly supported semi-conductor substrates 10. FIG. 1 is a diagrammatic longitudinal cross-sectional view of a portion of the exemplary ALD apparatus 1, comprising an exchange section 100 and a process tunnel 200 that is connected thereto.

The exchange section 100 may comprise a body 102. The body 102 may define at least a portion of a passage 104, via which an exterior 2 of the apparatus 1 is in open communication with a process space 202, and through which a substrate 10, e.g. a silicon wafer, is exchangeable between the exterior 2 and the process space 202. The passage 104 may extend in a passage direction P. The portion of the passage 104 defined by the body 102 of the exchange section 100 may be bound by an upper passage wall 110, a lower passage wall 120, and two lateral side passage walls (not shown). The upper passage wall 110 and the lower passage wall 120 may be oriented horizontally, mutually parallel and be spaced apart slightly, e.g. 0.5-1 mm, such that a substantially flat or planar substrate 10, having a thickness of for example 0.1-0.8 mm and oriented parallel to the upper 110 and lower 120 passage walls, may cross the passage 104 without contacting them. Of course, the precise dimensions of the portion of the passage 104 defined by the body 102 may generally depend on the type of apparatus 1 and the type of substrates 10 to be processed therein. For example, in case glass plates having a thickness of 4-5 mm are to be processed instead of silicon wafers, the gap between the upper 110 and lower 120 passage walls would be larger.

Both the upper passage wall 110 and the lower passage wall 120 may be provided with at least one exchange fluid injection channel 112, 122 that terminates in an exchange fluid injection point in the passage 104. In order to impart a desired directional velocity component to the exchange fluid that is to be injected into the passage 104, the exchange fluid injection channels 112, 122, or at least the portions thereof adjacent to the exchange fluid injection points, may be oriented at a suitable angle relative to the passage direction P. For example, in the exemplary embodiment of FIG. 1 the atmosphere in the process space 202 is to be maintained at an overpressure relative to the atmosphere in the exterior 2. The exchange fluid flow to be effected in the passage 104 will therefore be directed towards the process space 202, i.e. to the right. The portions of the exchange fluid injection channels 112, 122 adjacent the exchange fluid injection points may thus be oriented at an acute angle, preferably an angle in the range of 0-45 degrees, with respect to the passage direction P, such that injected exchange fluid will be imparted with a velocity component in the direction of the atmosphere with the higher pressure, i.e. the process space atmosphere.

Each of the exchange fluid injection channels 112, 122 may be connected to exchange fluid flow provision means 114, 124, such as a pump or a mass flow controller. The exchange fluid flow provision means 114, 124 may be configured to provide for a flow of exchange fluid through the respective exchange fluid injection channels 112, 122 at a selected flow rate. To this end, the exchange fluid flow provision means may be fed with exchange fluid in any suitable manner. Exchange fluid may for example be withdrawn from the atmosphere in exterior 2 (such as in the embodiment of FIG. 1), be received via a closed circulation circuit or be extracted from a (pressurized) exchange fluid reservoir or container.

Between the body 102 of the exchange section 100 and the structure of the process tunnel 200, a vertically extending gap 106 exists. The gap 106 forms an exchange fluid discharge channel that provides for an open connection between the passage 104 and the exterior 2. For clarity it is noted that, in the embodiment of FIG. 1, the passage 104 extends beyond the body 102 of the exchange section 100; that is, the passage 104 extends from the exterior 2 (on the left), through the body 102 of the exchange section 100 and onwards to the right, up to the process space 202. The exchange fluid discharge channel 106 connects to the passage 104 a point 108, which point may be said to be situated on the crossing of the passage 104 and the discharge channel 106. In the embodiment of FIG. 1, point 108 may be chosen as a stagnation region whose function will be clarified below.

The apparatus 1 according to the present invention may further include a process tunnel 200 through which a substrate 10, preferably as part of a train of substrates, may be conveyed in a linear manner. That is, the substrate 10 may be inserted into the process tunnel 200 via the exchange section 100 to be uni-directionally conveyed to an exit of the process tunnel, which exit may be provided with another exchange section similar to the one shown. Alternatively, the process tunnel 200 may have a dead end and the substrate 10 may undergo a bi-directional motion from the depicted exchange section 100 of the process tunnel 200, towards the dead end, and back to the exchange section 100. Such an alternative bi-directional system may be preferred if an apparatus with a relatively small footprint is desired. Although the process tunnel 200 itself may be rectilinear, such need not necessarily be the case.

The process tunnel 200 may include four walls: an upper wall 210, a lower wall 220, and two lateral or side walls (not shown). The upper wall 210 and the lower wall 220 may be oriented horizontally, mutually parallel and be spaced apart slightly, e.g. 0.5-1 mm, such that a substantially flat or planar substrate 10, having a thickness of for example 0.1-0.8 mm and oriented parallel to the upper 210 and lower 220 walls, may be accommodated therebetween without touching them. The lateral walls, which may be oriented substantially vertically and mutually parallel, may interconnect the upper wall 210 and the lower wall 220 at their lateral sides. The lateral walls may be spaced apart by a distance somewhat larger than a width of a substrate 10 to be processed, e.g. its width plus 0.1-3 mm. Accordingly, the walls of the process tunnel 200 may define and bound an elongate process tunnel space 202 having a relatively small volume per unit of tunnel length, and capable of accommodating one or more substrates 10 that are successively arranged in the longitudinal direction of the tunnel.

Both the upper tunnel wall 210 and the lower tunnel wall 220 may be provided with a plurality of gas injection channels 212, 222. The gas injection channels 212, 222 in either wall 210, 220 may be arranged as desired as long as at least a number of them is dispersed across the length of the tunnel 200. Gas injection channels 212, 222 may, for example, be disposed on the corners of an imaginary rectangular grid, e.g. a 25 mm×25 mm grid, such that gas injection channels are regularly distributed over an entire inner surface of a respective wall 210, 220, both in the longitudinal and transverse direction thereof.

The gas injection channels 212, 222 may be connected to gas sources, preferably such that gas injection channels in the same tunnel wall 210, 222 and at the same longitudinal position thereof are connected to a gas source of a same gas or gas mixture. For ALD-purposes, the gas injection channels 212, 222 in at least one of the lower wall 210 and the upper wall 220 may, viewed in the longitudinal direction of the tunnel, be successively connected to a first precursor gas source, a purge gas source, a second precursor gas source and a purge gas source, so as to create a process tunnel segment 204 that—in use—will comprise successive (tunnel-wide) gas zones including a first precursor gas, a purge gas, a second precursor gas and a purge gas, respectively. It in understood that one such a tunnel segment 204 corresponds to a single ALD deposition cycle. Accordingly, multiple tunnel segments 204 may be disposed in succession along the longitudinal direction of the process tunnel 200 to enable the deposition of a film of a desired thickness. Different segments 204 within the process tunnel 200 may, but need not, comprise the same combination of precursors. Differently composed segments 204 may for example be employed to enable the deposition of mixed films.

Whether opposing gas injection channels 212, 222 that share a same longitudinal position of the process tunnel but that are situated in opposite tunnel walls 210, 220, are connected to gas sources of the same gas composition may depend on the desired configuration of the apparatus 1. In case double-sided deposition is desired, i.e. ALD treatment of both the upper surface 10*a* and lower surface 10*b* of a substrate 10 travelling through the process tunnel 200, opposing gas injection channels 212, 222 may be connected to the same gas source. Alternatively, in case only single-sided deposition is desired, i.e. ALD treatment of merely one of the upper surface 10a and lower surface 10b of a substrate 10 to be processed, gas injection channels 212, 222 in the tunnel wall 210, 220 facing the substrate surface to be treated may be alternatingly connected to a reactive and an inert gas source, while gas injection channels in the other tunnel wall may all be connected to an inert gas source.

In the exemplary embodiment of FIG. 1, the gas injection channels 212 in the upper wall 210 are successively connected to a trimethylaluminum ($Al_2(CH_3)_2$, TMA) source, a nitrogen ($N_2$) source, a water ($H_2O$) source, and a nitrogen source, so as to form a series of identical tunnel segments 204 suitable for performing aluminum oxide ($Al_2O_3$) atomic layer deposition cycles. The gas injection channels 222 in the lower tunnel wall 220, in contrast, are all connected to a nitrogen source. Accordingly, the exemplary apparatus 1 is set up to maintain an upper depositing gas bearing and a lower non-depositing gas bearing, together configured to perform single-sided deposition on a top surface 10a of a passing, floatingly supported substrate 10.

Each of the lateral walls of the process tunnel 200 may, along its entire length or a portion thereof, be provided with a plurality of gas exhaust channels, configured to discharge process gas from the process space. The gas exhaust channels may be connected to and discharge into gas exhaust conduits provided on the outside of the process tunnel. In case the apparatus 1 is set up to perform ALD, the exhaust gases may contain quantities of unreacted precursors. Accordingly, it may be undesirable to connect gas exhaust channels associated with mutually different reactive gas zones to the same gas exhaust conduit (which may unintentionally lead to chemical vapor deposition). Different gas exhaust conduits may thus be provided for different precursors. It will be understood that the gas sources, to which the gas injection channels 212, 222 are connected, and the gas exhaust channels may together act to regulate the pressure in the process space 202.

The general operation of the apparatus 1 may be described as follows, starting with the exchange section 100.

In use, both the exchange fluid injection channels 112, 122 in the upper and lower passage walls 110, 120 inject exchange fluid into the passage 104. In the embodiment of FIG. 1, this exchange fluid is air, extracted from the exterior atmosphere by the exchange fluid flow provision means 114, 124.

The flow rate of the exchange fluid upon injection may be chosen such that its static pressure is substantially equal to the pressure of the exterior atmosphere, while its dynamic pressure is substantially equal to the absolute difference between the pressure of the exterior atmosphere and the pressure of the atmosphere in the process space. This implies that the stagnation pressure of the exchange fluid is substantially equal to the pressure of the process space atmosphere. Once the exchange fluid is injected into the passage 104, it flows towards the process space 202. Entering the process space 202 via the relatively narrow passage 104, however, is prevented by the atmospheric pressure in the process space 202. This pressure purposefully equals the stagnation pressure of the flow of exchange fluid, which causes the flow of exchange fluid to stagnate around point 108, located at the entrance to the process space 202. Due to the continuity of the exchange fluid injection and the pressure differential between the exterior atmosphere and the stagnated exchange fluid, the exchange fluid will be naturally discharged, via exchange fluid discharge channel 106, to the exterior 2 from which it was withdrawn earlier. It is understood that, as a result of the pressure equilibrium, virtually no exchange of fluids takes place between the stagnation region 108 and the process space 202. The process space 202 is thus practically sealed off from the exterior 2 without the use of mechanical closing means, while the exchange of substrates 10 via the passage 104 is still possible.

A substrate 10 may for example be inserted into the process space 202 via passage 104. As the substrate 10 is moved into the passage 104, it is accommodated between an upper and a lower exchange fluid bearing. These fluid bearing are provided by the exchange fluid injected via the exchange fluid injection channels 112, 122 in the upper 110 and lower 120 passage wall, respectively. The fluid bearings cushion the substrate 10, and exert a drag on the upper 10a and lower 10b main surfaces thereof, thereby forcing the substrate in the direction of the process space 202.

Depending on the precise configuration of the apparatus 1 and its working parameters, such as the pressure of the process space atmosphere, the drag exterted on a substrate 10 in case the stagnation pressure of the injected exchange fluid is chosen to be substantially equal to the pressure of the process space atmosphere may not be sufficient to overcome the effect of the pressure differential across the passage 104. That is to say, the drag exerted on a substrate 10 due to the flow of exchange fluid may be insufficient to overcome the effect of the pressure differential and to provide for a net inward force on the substrate 10, i.e. a force directed towards the process space 202. In such a case, the flow rate at which exchange fluid is injected into the passage 104 may be increased to increase the inward drag force on the substrate 10, so as to further facilitate its insertion into the tunnel 200. An increase in flow rate relative to the equilibrium situation described above need not be permanent, but may be applied only upon actual exchange, e.g. insertion or extraction, of a substrate 10.

Figure 2:
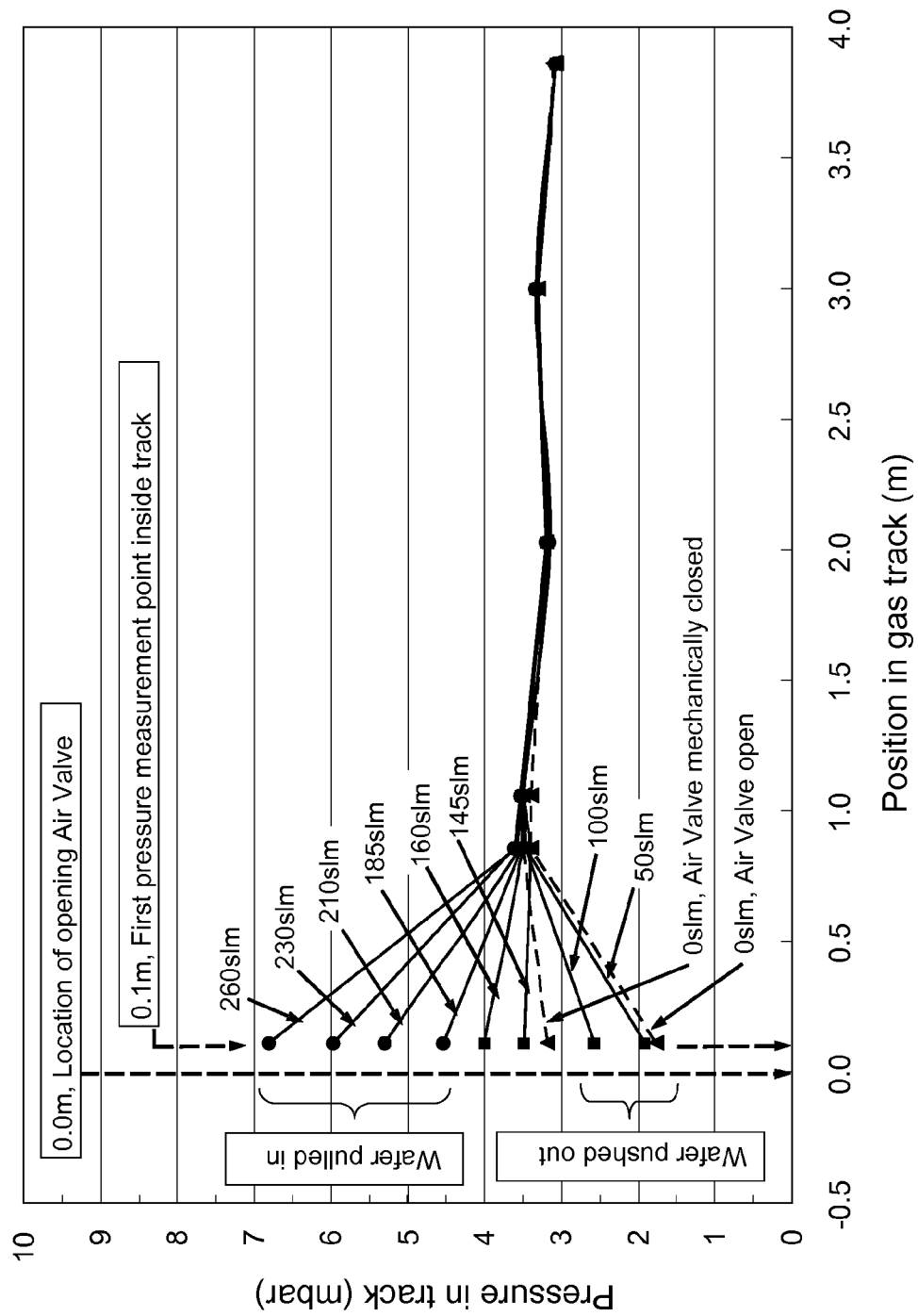
FIG. 2 is a graph comprising measurement data, illustrating the relation between the volumetric gas flow rate at which fluid is injected into the passage of the exchange section, and the pressure profile in the process tunnel space, seen from the exchange section inwards.

The effect of altering the flow rate at which exchange fluid is injected into the passage 104 may be illustrated with reference to FIG. 2. FIG. 2 is a graph comprising measurement data, illustrating the relation between the volumetric gas flow rate at which exchange fluid is injected into the passage 104 in the exchange section 104, and the pressure profile in the process tunnel space 202, seen from the exchange section 100 inwards. FIG. 2 lists the pressure profiles for 10 different situations, including 8 different exchange fluid injection flow rates. Each pressure profile comprises six pressure data points. The pressure data was acquired without any substrates being present in the passage 104 or the process space 202.

The pressure profile labeled "air valve open" pertains to a situation in which no exchange fluid is injected into the passage 104. Due to the overpressure of about 3.4 mbar (i.e. 340 Pa) in the bulk of the process space 202 relative to the exterior 2, there is an outflow of atmospheric fluid from the process space 202. This outflow is naturally accompanied by a pressure drop. The outflow of atmospheric fluid may be stopped by mechanically closing the passage 104, as is illustrated by the pressure profile labeled "air valve mechanically closed". When the passage 104 is mechanically closed, the pressure in the process space 202 is substantially uniform along its length. However, exchange of substrates 10 between the exterior 2 and the process space 202 is now impossible.

FIG. 2 illustrates that an equilibrium situation, in which there is no pressure gradient to drive atmospheric fluid out of or into the process space 202, exists when exchange fluid is injected into the passage 104 at a flow rate of 145 standard liters per minute (slm). At this flow rate the stagnation pressure of the exchange fluid is substantially equal to the pressure of the process space atmosphere. Tests have indicated that, at a flow rate of 145 slm, the drag force exerted by the exchange fluid flow on a substrate 10 extending through the passage 104 is insufficient to provide for a net inwards force on the substrate.

To facilitate the insertion of substrates 10 into the process space 202, the flow rate at which exchange fluid is injected may be increased. It is noted that this flow rate may be directly related to the stagnation pressure of the exchange fluid, as it may be shown that the flow rate of the exchange fluid upon injection is, to good approximation, proportional to the square root of the dynamic pressure. Increasing the injection flow rate of the exchange fluid thus corresponds to increasing its stagnation pressure.

FIG. 2 illustrates that flow rates of 185 slm, 210 slm, 230 slm and 260 slm generate sufficient drag on a substrate to drive it inwards. Such increased flow rates (relative to the 145 slm that provides for an equilibrium situation) are accompanied by an inflow of exchange fluid into the process space 202; i.e. the stagnation point of the exchange fluid flow lies in the process space. This need not be a problem. As is clear from FIG. 2, the effect of exchange fluid penetrating into the process space 202 is essentially limited to the first meter of process tunnel 200. In this respect, to avoid interference with any deposition process in the process space 202, a first section of the process tunnel 200 adjacent the exchange section 100 may be a non-depositing section, for example aimed at pre-heating an inserted substrate 10, or at cooling a substrate 10 whose treatment has been completed.

It will be understood that a configuration wherein substrates are 'dragged into' the process space 202 greatly facilitates their insertion. Not only does it overcome the need to mechanically force the substrates 10 in, it also aids in accelerating the substrates to at least an initial speed at which they may traverse the process tunnel 200. By the same token substrates 10 may be slowed down using an exchange section 100 provided at an end/exit of the process tunnel 200. At such an exit, the differential pressure across the passage 104 might normally force a substrate 10 out of the process space 202 at high speed. This can be prevented by providing for an oppositely directed drag on the substrate 10 that advantageously mitigates or balances the effect of the pressure differential. In preventing the pressure differential from 'launching' a substrate 10 from the process space 202, flow rates below 145 slm, such as 50 slm and 100 slm, may preferably be avoided during exchange of the substrate 10.—Is is pointed out that both the 'speeding up' of a substrate 10 at the entrance and the 'slowing down' at the exit of the process tunnel 200 may be described as an "acceleration into the direction of the flow of exchange fluid". Hence 'acceleration' is to be interpreted physically, as the effect of a net force on an object, in accordance with Newton's second law.

For completeness, it is noted that 1 standard liter per minute refers to a flow of 1 dm$^3$ of fluid, at a temperature of 0° C. and a pressure of 1.01325 bar/1 atmosphere/ 1.01325·10$^5$ Pa) per 60 seconds.

Attention is now invited to the operation of the process tunnel 200. In use, both the gas injection channels 212, 222 in the upper wall 210 and the lower wall 220 inject gas into the process tunnel space 202. Each gas injection channel 212, 222 may inject the gas provided by the gas source to which it is connected. As the apparatus 1 is capable of operating at both atmospheric and non-atmospheric pressures, gas injection may take place at any suitable pressure. However, to render vacuum pumps superfluous, and to prevent accidental leakage of exterior atmospheric fluids into the process space 202, the process space may preferably be kept at a pressure slightly above atmospheric pressure. Accordingly, gas injection may take place at a pressure a little above atmospheric pressure, e.g. at an overpressure on the order of 1-2 mbar (i.e. 100-200 Pa). In case a lower pressure is maintained in gas exhaust conduits provided in the side walls, for example atmospheric pressure, the gas injected into the tunnel space 202 will naturally flow sideways, transverse to the longitudinal direction of the process tunnel.

In case a substrate 10 is present between the upper and lower walls 210, 220, the gas(es) injected into the tunnel space 202 by the gas injection channels 212 in the upper wall 210 may flow sideways between the upper wall and a top surface 10a of the substrate, so as to provide for an upper gas bearing. Likewise, the gas(es) injected into the tunnel space 202 by the gas injection channels 222 in the lower wall 220 will flow sideways between the lower wall and a lower surface 10b of the substrate 10, effectively providing for a lower gas bearing. The lower and upper gas bearings may together encompass and floatingly support the substrate 10.

To deposit a film onto a substrate 10, the substrate may be moved through the process tunnel space 202. Movement of the substrate 10 may be effected in any suitable way, both by contact and non-contact methods. Non-contact methods are preferred, among other reasons because wearable mechanical parts for driving substrates may typically complicate the design of apparatus and increase the need for maintenance. Contactless methods of propelling a substrate 10 may include propulsion by directed gas streams effected through gas injection channels 212, 220 that are placed at an angle relative to a transport direction, such that the injected gas streams have a tangential component in that transport direction; propulsion by electric forces and/or magnetic forces; propulsion by gravity (which may be effected by inclining the entire process tunnel 200 with respect to the horizontal), and any other suitable method.

Whatever method of driving the substrate 10 is chosen, care must be taken to ensure a suitable substrate transport velocity is effected. In the ALD-apparatus of FIG. 1, the transport velocity of the substrate 10 is preferably such that, when passing a specific precursor gas zone, a patch of substrate surface area is exposed to the precursor sufficiently long to ensure that it is fully saturated. A longer precursor zone generally allows for a higher transport velocity, and vice versa. Note, however, that the saturation time may depend on the nature of the precursor being used, and on the concentration of the precursor in the respective zone.

As the substrate 10 moves through the process tunnel space 202 of FIG. 1 its upper surface 10a is strip-wise subjected to the gases present in each of the successively arranged and traverse gas zones. Provided that the arrangements of the zones and the respective gases are chosen properly, traversal of one tunnel segment 204 may be equivalent to subjecting the substrate 10 to one atomic layer deposition cycle. Since the tunnel 200 may comprise as many segments 204 as desired, a film of arbitrary thickness may be grown on the substrate 10 during its crossing of the tunnel. The linear nature of the process tunnel 200 further enables a continuous stream of substrates 140 to be processed, thus delivering an atomic layer deposition apparatus 1 with an appreciable throughput capacity.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS 1 substrate processing apparatus
2 exterior
10 substrate
10a,b upper (a) and lower (b) main surface of substrate
100 exchange section
102 body of exchange section
104 passage
106 exchange fluid discharge channel
108 stagnation region
110 upper passage wall
112 exchange fluid injection channel in upper passage wall
114 exchange fluid flow provision means
120 lower passage wall
122 exchange fluid injection channel in lower passage wall
124 exchange fluid flow provision means
200 process tunnel
202 process tunnel space
204 process tunnel segment
210 upper tunnel wall
212 gas injection channels in upper tunnel wall
220 lower tunnel wall
222 gas injection channels in lower tunnel wall
P passage direction

We claim:

1. A substrate processing apparatus comprising:
a process tunnel defining a process space therein, the process space configured to selectively contain at least a portion of a substrate;
an exchange section proximate the process tunnel and defining a passage having first and second ends, the first end having an opening, the passage first end opening being in communication with the process space and configured to enable transfer of at least a portion of the substrate between the passage and the process space, the exchange section having an upper passage wall and a lower passage wall together defining an upper and lower extent of the passage, wherein the exchange section has at least one exchange fluid channel therein and at least one of the upper passage wall and the lower passage wall having a respective exchange fluid injection point configured to enable selective injection of an exchange fluid from a respective one of the at least one exchange fluid channel into the passage proximate the first end opening; and
at least one exchange fluid discharge channel configured to discharge the exchange fluid from the passage, wherein the at least one exchange fluid discharge channel comprises a vertically extending gap, whereby an increase in pressure within the passage associated with selective injection of the exchange fluid from the at least one exchange fluid channel inhibits gaseous pressure equalization between the process space and an atmosphere external to the substrate processing apparatus via the passage,
wherein the passage defines a passage direction,
wherein at least one of the exchange fluid injection points is further configured to create, when injecting the exchange fluid in the passage, an exchange fluid flow having a direction substantially parallel to the passage direction, and
wherein the process tunnel comprises an upper tunnel wall and a lower tunnel wall together defining an upper and lower extent of the process space.

2. The substrate processing apparatus of claim 1, wherein the process tunnel comprises at least one process gas injection channel configured to inject at least one process gas into the process space and to maintain a process space atmosphere in the process space at a process space pressure,
wherein the process space pressure is greater than the atmosphere external to the substrate processing apparatus.

3. The substrate processing apparatus of claim 1, wherein a vertical distance between the upper passage wall and the lower passage wall at the second end of the passage is greater than a vertical distance between the upper passage wall and the lower passage wall at the first end of the passage.

4. The substrate processing apparatus of claim 1, wherein the at least one of the exchange fluid injection channels, at least a portion thereof adjacent to the exchange fluid injection point, has an angle in a range between 0 and 45 degrees with the passage direction, as seen in a longitudinal cross-sectional side view along the passage direction.

5. The substrate processing apparatus of claim 4, wherein the at least one of the exchange fluid injection points configured to create the exchange fluid flow comprises a first exchange fluid injection point located in the upper passage wall and a second exchange fluid injection point located in the lower passage wall.

6. The substrate processing apparatus of claim 1, further comprising a pump configured to provide the exchange fluid to the at least one exchange fluid channel.

7. The substrate processing apparatus of claim 1, further comprising a mass flow controller configured to provide the exchange fluid to the at least one exchange fluid channel.

8. The substrate processing apparatus of claim 1, wherein the at least one exchange fluid discharge channel is connected to the at least one exchange fluid channel, and
the at least one exchange fluid discharge channel is configured to discharge the exchange fluid from the passage into the at least one exchange fluid channel.

9. The substrate processing apparatus of claim 1, wherein the at least one exchange fluid discharge channel is located at a position that is more proximate in the passage direction to the process tunnel than a position of the respective exchange gas injection point is to the process tunnel in the passage direction.

10. The substrate processing apparatus of claim 1, wherein the at least one exchange fluid discharge channel is orthogonal to the passage.

11. The substrate processing apparatus of claim 1, wherein the at least one exchange fluid discharge channel comprises a first exchange fluid discharge channel between an upper part of a body of the exchange section and an upper part of a structure of the process tunnel, and a second exchange fluid discharge channel between a lower part of the body of the exchange section and a lower part of the structure of the process tunnel.

12. The substrate processing apparatus of claim 1, wherein the at least one exchange fluid discharge channel is located at a position proximate to the first end of the exchange section.

13. The substrate processing apparatus of claim 1, wherein the vertically extending gap is positioned between the exchange section and the process tunnel.

14. The substrate processing apparatus of claim 1, wherein the at least one exchange fluid discharge channel is disposed between a body of the exchange section and a structure of the process tunnel,
   wherein the exchange fluid flows downstream from the exchange fluid injection point to the exchange fluid discharge channel in an exchange fluid flow direction, and
   wherein the exchange fluid flow substantially stagnates in the exchange fluid flow direction in a stagnation region that extends over an entire width of the passage, the stagnation region being located downstream of the exchange fluid injection point and at or upstream of the exchange fluid discharge channel.

15. The substrate processing apparatus of claim 1, the at least one exchange fluid channel is configured to inject the exchange fluid as a laminar fluid flow that is substantially parallel to the passage direction.

16. The substrate processing apparatus of claim 1, wherein the at least one exchange fluid channel comprises at least one upper exchange fluid injection channel in the upper passage wall and at least one lower exchange fluid injection channel in the lower passage wall,
   the at least one upper exchange fluid injection channel is configured to provide for an upper exchange fluid bearing,
   the at least one lower exchange fluid injection channel is configured to provide for a lower exchange fluid bearing, and
   the lower exchange fluid bearing and upper exchange fluid bearing being configured to floatingly support and accommodate at least a portion of a substrate there between.

17. The substrate processing apparatus of claim 1, wherein a vertical distance between the upper passage wall and the lower passage wall at the first end of the passage is less than a vertical distance between the upper tunnel wall and the lower tunnel wall bounding the process space.

18. The substrate processing apparatus of claim 1, wherein a vertical distance between the upper passage wall and the lower passage wall at the first end of the passage is greater than a vertical distance between the upper tunnel wall and the lower tunnel wall bounding the process space.

19. A substrate processing apparatus comprising:
   a process tunnel comprising an upper tunnel wall and a lower tunnel wall, the upper tunnel wall and the lower tunnel wall forming a process space there between for accommodating a substantially flat and planar substrate;
   an exchange section having a first end connected to the process tunnel and a second, opposing end, the exchange section comprising an upper passage wall and a lower passage wall spaced apart over a distance slightly more than the thickness of a substrate, the upper and lower passage walls forming a passage in a passage direction for exchanging substrates between an exterior and the process space,
   wherein each one of the upper passage wall and the lower passage wall has an exchange fluid injection channel at one end terminating in the passage at an exchange fluid injection point configured to inject exchange fluid into the passage, portions of the exchange fluid injection channels adjacent to the corresponding exchange fluid injection point making an angle in a range between 0 and 45 degrees with the passage direction, as seen in a longitudinal cross-sectional side view along the passage direction, so as to create an exchange fluid flow in the passage having a direction substantially parallel to the passage direction, the exchange fluid injection channels being connected to a pump or a mass flow controller configured to provide the exchange fluid to the exchange fluid injection channels, and
   each one of the upper passage wall and the lower passage wall has an exchange fluid discharge channel between the exchange section and the process tunnel at a position spaced apart from the exchange fluid injection points in the passage direction, in a direction of the exchange fluid flow, wherein each of the exchange fluid discharge channels comprises a vertically extending gap.

20. The substrate processing apparatus of claim 19, wherein the exchange fluid discharge channels are at the first end of the exchange section.

21. The substrate processing apparatus of claim 19, wherein the first end has a spacing that is less than the spacing between the upper and lower tunnel walls, creating a relatively narrow passage opening.

* * * * *